United States Patent
Ma

(12) 
(10) Patent No.: US 7,128,593 B2
(45) Date of Patent: Oct. 31, 2006

(54) LAND GRID ARRAY SOCKET HAVING ACCESSORIAL PRESSING MEMBERS

(75) Inventor: Hao-Yun Ma, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/994,082

(22) Filed: Nov. 19, 2004

(65) Prior Publication Data
US 2005/0112926 A1    May 26, 2005

(30) Foreign Application Priority Data
Nov. 21, 2003   (TW) .............................. 92220594 U

(51) Int. Cl.
*H01R 13/62* (2006.01)
(52) U.S. Cl. ........................................ 439/331; 439/73
(58) Field of Classification Search ................. 439/71, 439/72, 73, 330, 331, 525, 526
See application file for complete search history.

(56) References Cited
U.S. PATENT DOCUMENTS

| | | | | |
|---|---|---|---|---|
| 4,390,220 A | * | 6/1983 | Benasutti | ..................... 439/71 |
| 4,504,105 A | * | 3/1985 | Barkus et al. | .............. 439/331 |
| 4,621,884 A | * | 11/1986 | Berkebile et al. | ........... 439/367 |
| RE32,370 E | * | 3/1987 | Bright et al. | ............... 439/367 |
| 5,241,453 A | * | 8/1993 | Bright et al. | ............... 361/704 |
| 5,302,853 A | * | 4/1994 | Volz et al. | .................. 257/707 |

* cited by examiner

*Primary Examiner*—Thanh-Tam Le
(74) *Attorney, Agent, or Firm*—Wei Te Chung

(57) ABSTRACT

An LGA socket includes a socket body (20) receiving a number of contacts (70), a stiffener (30) attached to the socket body, and a socket plate (40) and a load lever (50) respectively mounted to opposite ends of the stiffener. The socket plate has a connecting side (401) to connect the stiffener, a pressing side (402) to engage the load lever, and a pair of opposite lateral sides (403) respectively and integrally connected to the connecting side and the pressing side. The opposite lateral sides have a pair of clasping sections (4031) and a pair of accessorial pressing members (4032) adjacent the pressing side. The clasping sections and the accessorial pressing members can jointly press a top surface of the LGA package (60). Thus, reliable electrical connection between conductive pads on the LGA package and the corresponding contacts received in the socket body is ensured.

20 Claims, 7 Drawing Sheets

LAND GRID ARRAY SOCKET HAVING ACCESSORIAL PRESSING MEMBERS

BACKGROUND OF THE INVENTION

1. Field of the Invention

The present invention relates to electrical connectors, and more particularly, to a land grid array (LGA) socket having accessorial pressing members for reliable electrical connection between an LGA package and a circuit substrate, such as a printed circuit board (PCB).

2. Description of the Prior Art

An integrated circuit (IC) package having conductive pads arranged on a bottom surface thereof in a land grid array (LGA) fashion is known as an LGA package. LGA packages are widely used due to relatively low height and reliable electrical characteristics.

Connectors for removably mounting an LGA package on a PCB are known as LGA sockets. Normally, an LGA socket comprises a socket body and a stiffener attached to the socket body. The socket body defines an array of passageways for receiving contacts therein. Each contact has a spring arm and a terminal section protruding from opposite external surfaces of the socket body. The spring arm is resiliently urged to electrically engage with a corresponding conductive pad on the LGA package, while the terminal section is electrically mounted to the PCB.

When the LGA package is positioned on the socket body, the conductive pads of the LGA package rest on corresponding contacts received in the socket body. Electrical connection between the conductive pads and the corresponding contacts is obtained via elastic deflection and deformation of the spring arms. Thereupon, it is necessary to exert sufficient engaging force against the LGA package to maintain electrical engagement between the conductive pads and the corresponding contacts.

Heretofore, various LGA sockets each including a socket plate and a load lever to provide the engaging force are disclosed. Referring to FIGS. 5 to 7, a conventional LGA socket 8 comprises a socket body 82 receiving a plurality of contacts 81, a stiffener 83 attached to the socket body 82, and a socket plate 84 and a load lever 85. The socket plate 84 and the load lever 85 are pivotally assembled to opposite ends of the stiffener 83 respectively to fasten the LGA package 100 jointly.

The socket plate 84 includes a connecting side 840 to assemble to the stiffener 83, a pressing side 841 to engage with the load lever 85, and a pair of lateral sides 842 respectively and integrally connected to two ends of the connecting side 840 and the pressing side 841. The lateral sides 842 of the socket plate 84 are bent slightly downward to form a pair of clasping sections 843 thereunder.

In assembly, prior to positioning the LGA package 100 on the socket 8, the socket plate 84 and the load lever 85 are rotated away from the socket body 82. After the LGA package 100 is set on the socket body 82, with the conductive pads (not shown) resting on the corresponding contacts 81, the socket plate 84 is rotated with respect to the socket body 82 till the clasping sections 843 meet a top surface of the LGA package 100. Whereafter, the load lever 85 is rotated to clip the socket plate 83 and push the LGA package 100 to move downward. In a closed position, the clasping sections 843 press on the top surface of the LGA package 100 and hold the LGA package 100 in position, thereby providing the engaging force to assure electrical connection between the conductive pads and the corresponding contacts 81.

When the socket plate 84 is rotated to fasten the LGA package 100, the part of the socket plate 84 adjacent the connecting side 840 contacts the LGA package 100 foremost, which is liable to cause the LGA package 100 become inclined relative to and slide along a top surface of the socket body 82. As a result, the LGA package 100 may engage with the sidewalls of the socket body 82. When the LGA package 100 is driven down to electrically mate with the contacts 81, a considerable friction force between the LGA package 100 and the sidewalls is generated. The friction force will provide a vertical force and moment to tilt the LGA package and prevent the LGA package 100 from moving downward. Therefore, the conductive pads, especially the conductive pads distant from the connecting side 840, are prone to separate from the corresponding contacts received in the socket body 82. This will surely disturb electrical engagement between the conductive pads of the LGA package and the corresponding contacts 81 received in the socket body 82.

Heretofore, various efforts have been provided to eliminate the friction force between the LGA package and the sidewalls of the socket body, such as enhancing the loading force. This will increase interactional force among each electrical component and is prone to unfavorably affect electrical characteristics of the LGA socket.

Hence, a new LGA socket which overcomes the above-mentioned disadvantages of the prior art is desired.

SUMMARY OF THE INVENTION

Accordingly, a primary object of the present invention is to provide a land grid array (LGA) socket having accessorial pressing members for electrically connecting an LGA package with a circuit substrate, such as a printed circuit board (PCB), wherein conductive pads arranged on the LGA package are firmly and reliably connected with corresponding contacts received in the socket body.

To achieve the above object, an LGA socket of the present invention comprises a socket body having a plurality of contacts received therein, a stiffener attached to the socket body, and a socket plate and a load lever respectively mounted to opposite ends of the stiffener. The socket plate comprises a connecting side assembled to the stiffener, an opposite pressing side engaging with the load lever, and a pair of lateral sides respectively and integrally connected to two ends of the connecting side and the pressing side. The lateral sides have a pair of clasping sections bent slightly downward in a middle section thereof, and form a pair of accessorial pressing members extending downwardly therefrom adjacent the pressing side. The lower surfaces of the clasping sections and the accessorial pressing members jointly define an engaging force loading plane. When the socket plate is rotated to engage with the load lever, the clasping sections and the accessorial pressing members mate with a top surface of the LGA package simultaneously, thereby preventing the LGA package from tilting relative to and sliding along the socket body. Thus, the conductive pads on the LGA package can firmly and reliably mate with the corresponding contacts received in the socket body, and reliable electrical connection between the contacts and the corresponding conductive pads is ensured.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to describe the preferred embodiment of the present invention in detail.

Figure 1:
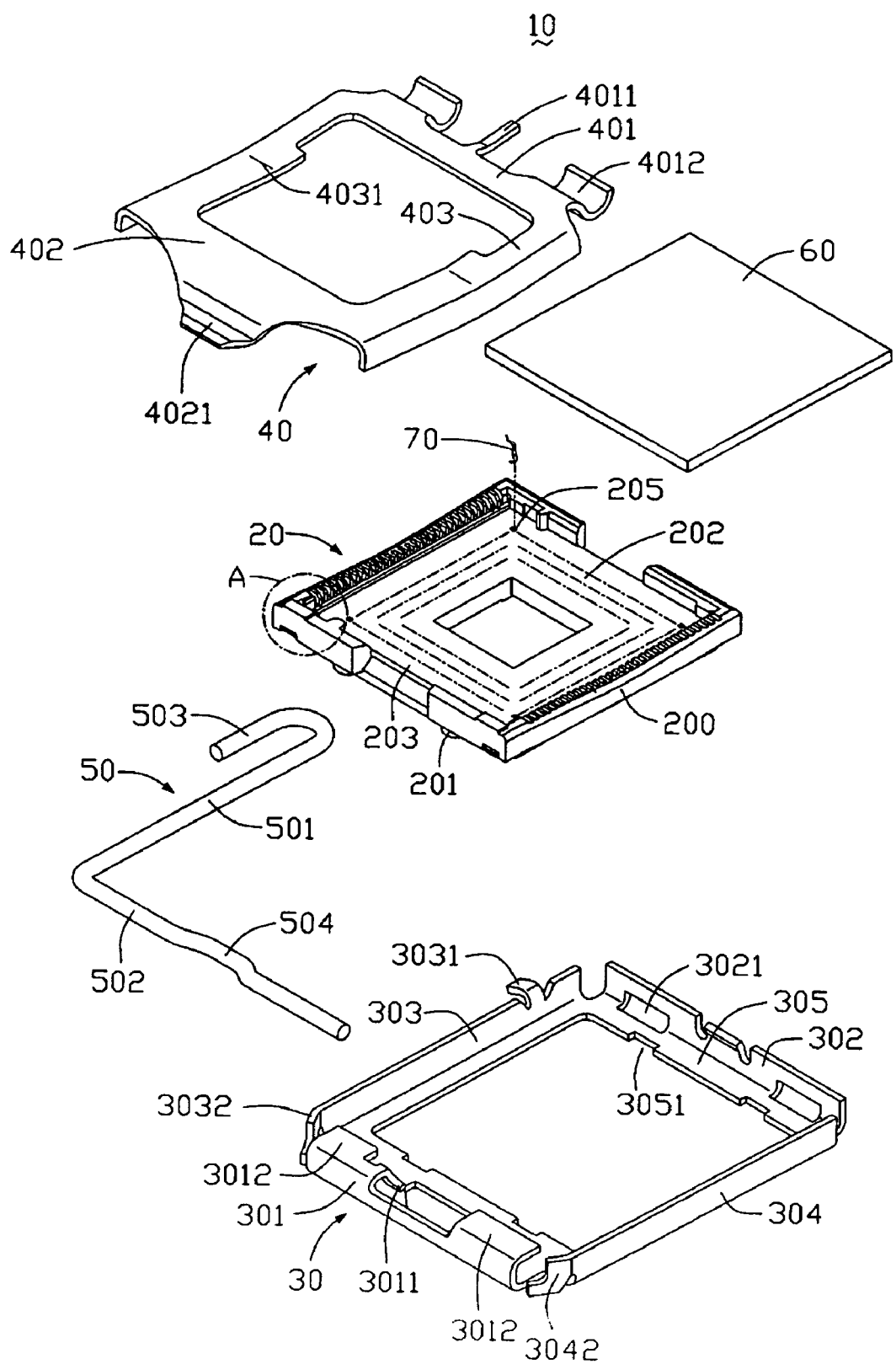
FIG. 1 is an exploded, isometric view of an LGA socket according to a preferred embodiment of the present invention.
Figure 4:
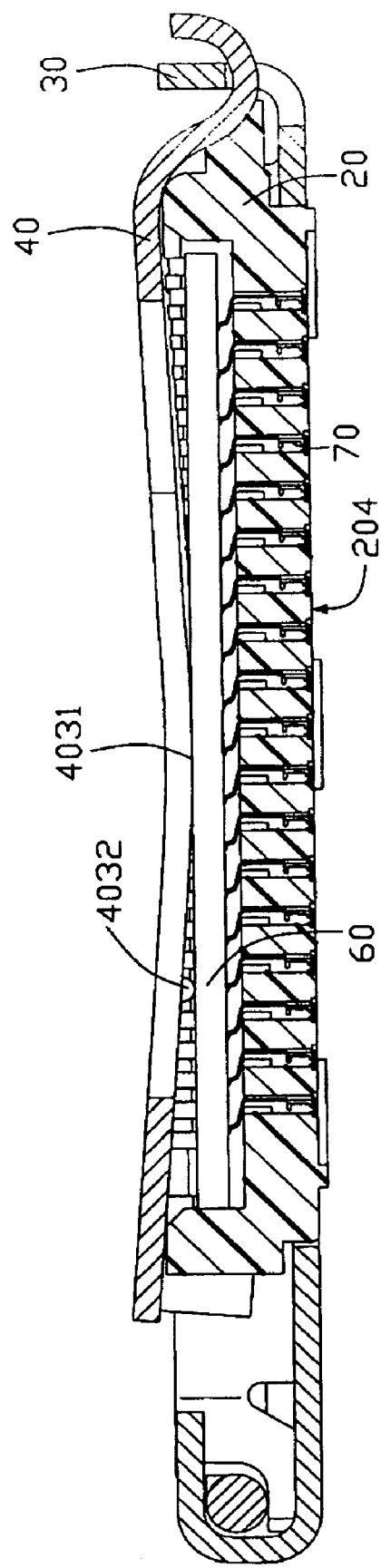
FIG. 4 is a cross-sectional view of the LGA socket taken along a line IV—IV of FIG. 3.
Figure 5:
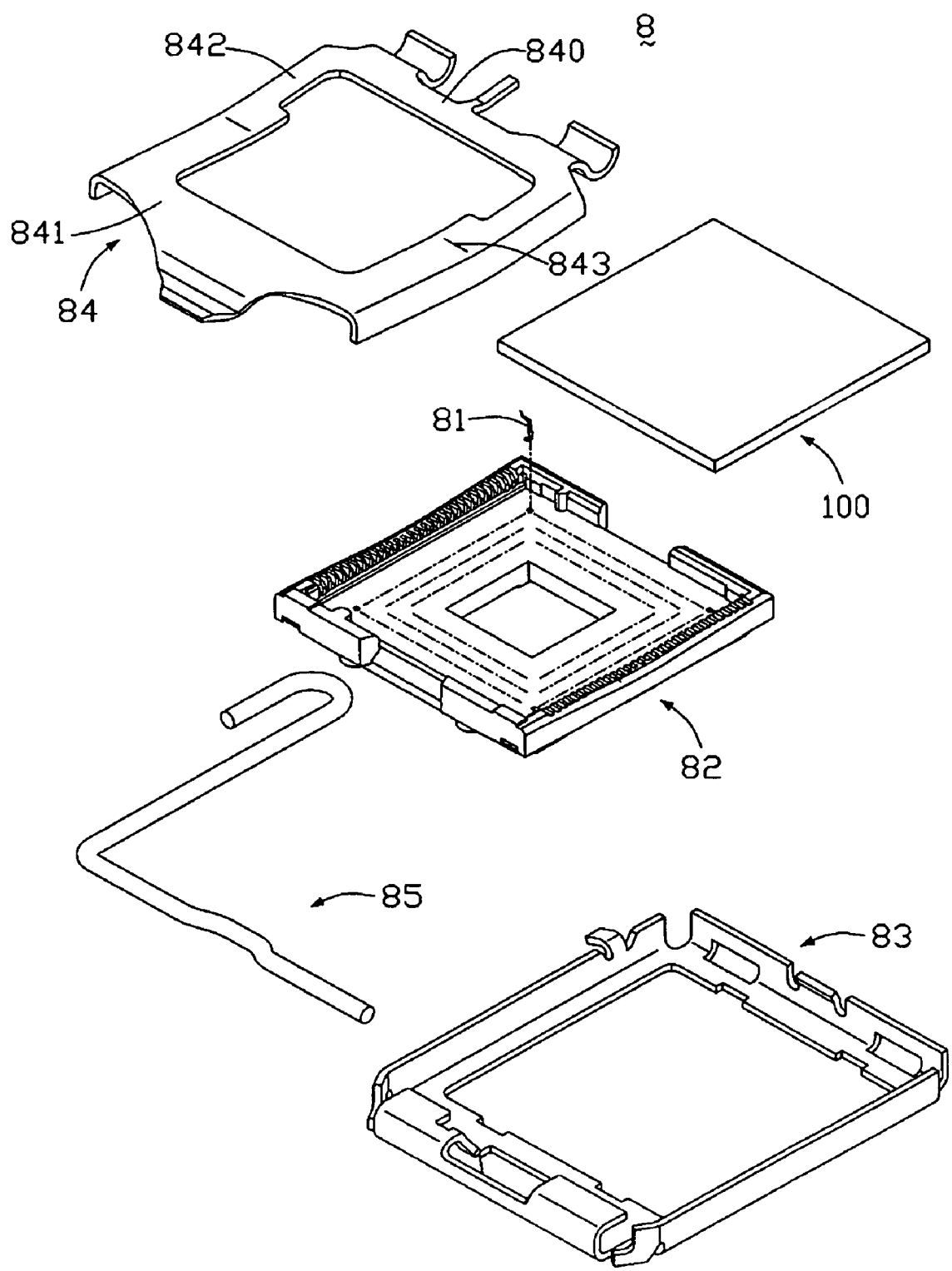
FIG. 5 is an exploded, isometric view of a conventional LGA socket.
Figure 6:
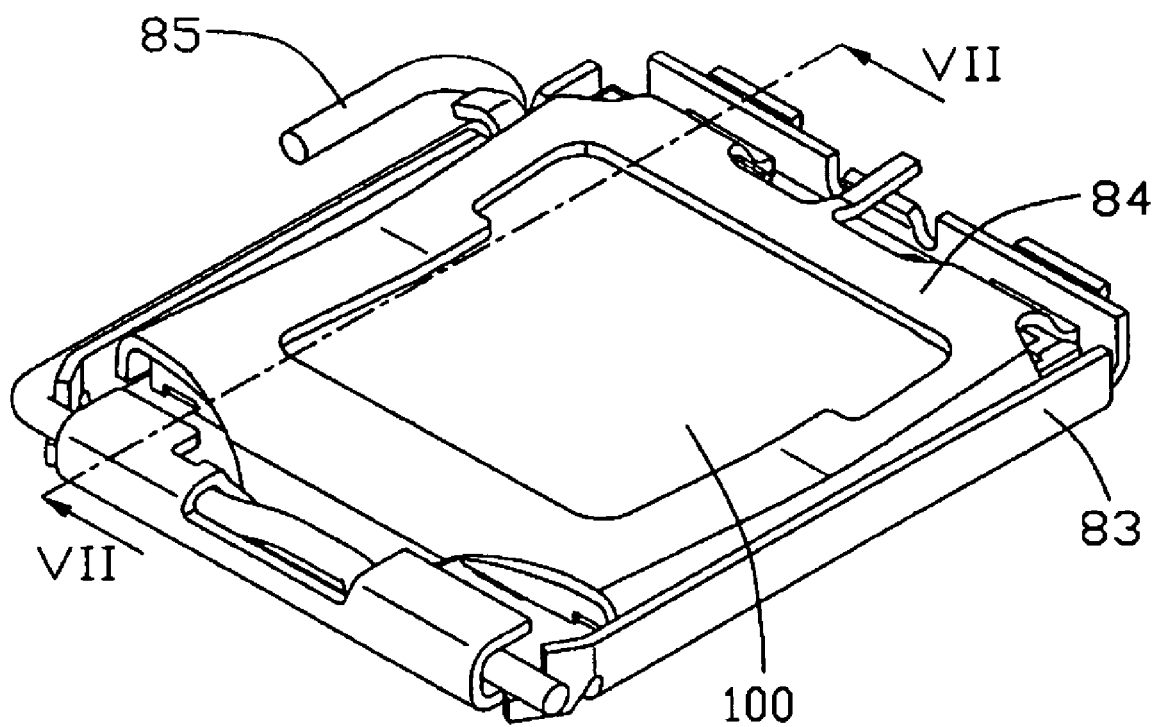
FIG. 6 is an assembled, isometric view of the conventional LGA socket shown in FIG. 5.
Figure 7:
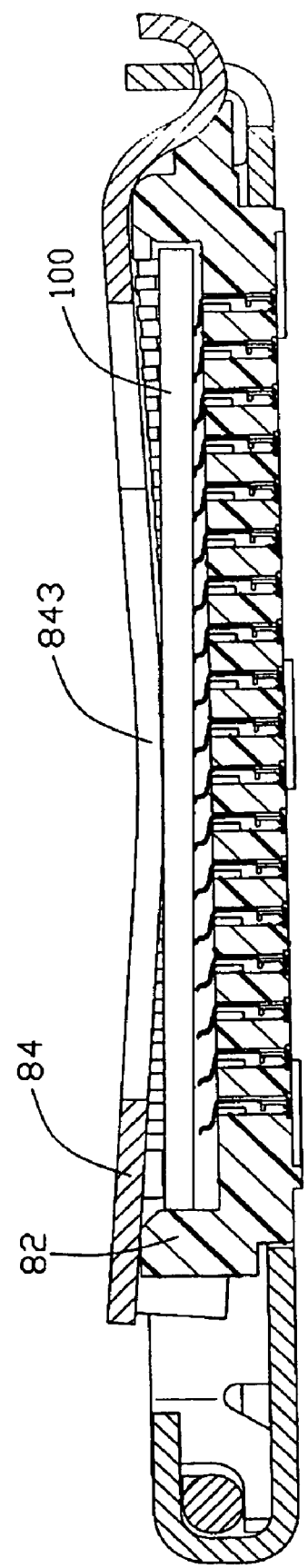
FIG. 7 is a cross-sectional view of the conventional LGA socket taken along a line VII—VII of FIG. 6.

Referring to FIGS. 1 and 4, an LGA socket 10 in accordance with a preferred embodiment of the present invention includes a socket body 20, a stiffener 30 attached to the socket body 20, and a socket plate 40 and a load lever 50 respectively mounted to opposite ends of the stiffener 30.

The substantially rectangular socket body 20 is made of insulative material and includes a plurality of sidewalls 200. The sidewalls 200 form a plurality of protrusions 201 extending outward therefrom, and cooperatively define an electric region 202 therebetween. The electrical region 202 has a supporting surface 203 to support an LGA package 60 thereon, a mounting surface 204 to be mounted on the PCB (not shown), and a plurality of passageways 205 extending therebetween for receiving a plurality of contacts 70 therein. Each contact 70 has a spring arm protruding from the supporting face 203 to resiliently engage with a corresponding conductive pad (not shown) on the LGA package 60, and a terminal section projecting beyond the mounting surface 204 for electrical attachment to the PCB. The spring arms of the contacts 70 are all bent toward a corner of the socket body 20, designated as "A" in FIG. 1.

The stiffener 30 is a rectangular metal fame having a front sidewall 301, a rear sidewall 302, a left sidewall 303, a right sidewall 304 and a base 305. The front sidewall 301 forms an inward bent containing section 3011, and a pair of securing section 3012 at either side of the containing section 3011. The rear sidewall 302 defines a pair of slots 3021 to receive a pair of braces 4012 extending outward from the socket plate 40. The left sidewall 303 forms a locking hook 3031 to hold the load lever 50. Each of the left sidewall 303 and the right sidewall 304 forms a pair of flanges 3032, 3042 extending toward the front sidewall 301. The containing section 3011, the securing section 3012 and the flanges 3032, 3042 jointly holds the load lever 50 in a proper position. A plurality of recesses 3051 is correspondingly defined in the base 305 for receiving the protrusions 201 of the socket body 10.

Figure 2:
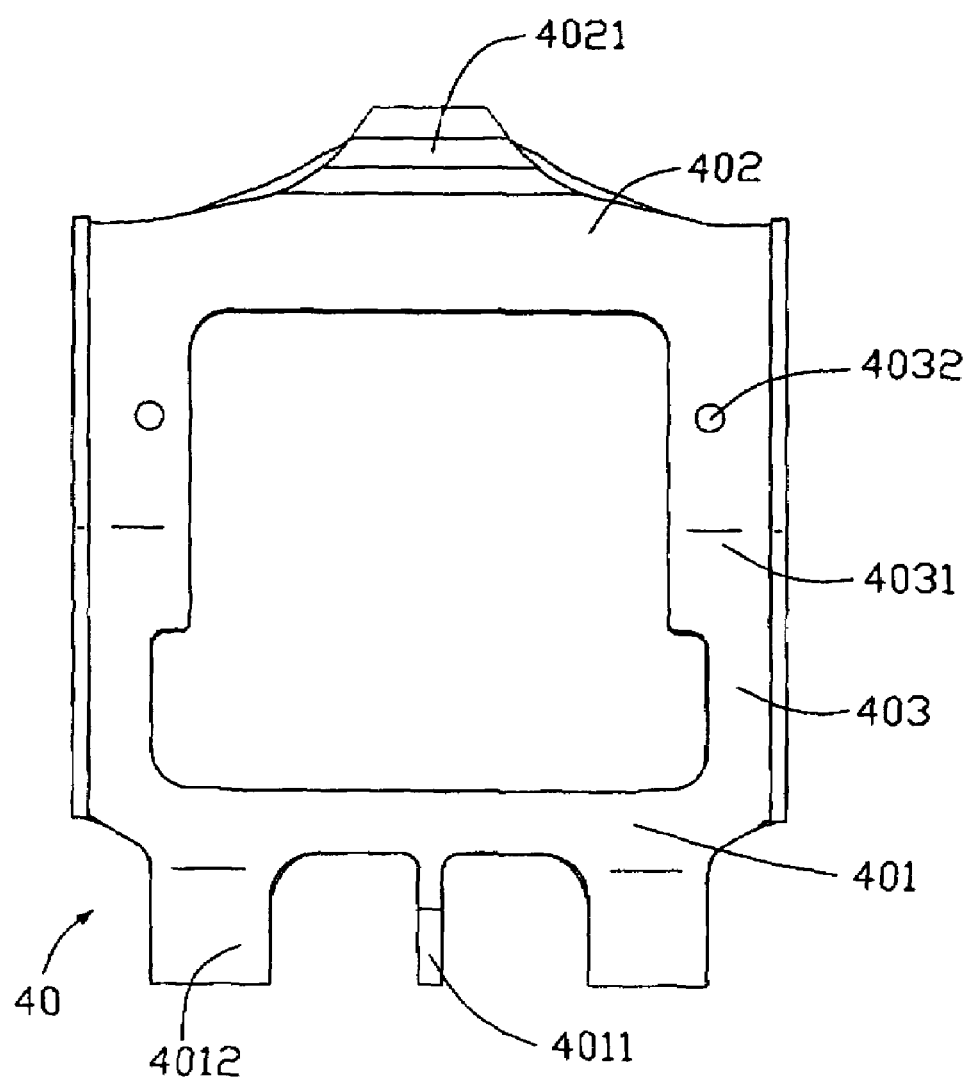
FIG. 2 is a bottom view of a socket plate shown in FIG. 1.

Referring to FIGS. 1, 2 and 4, the socket plate 40 has a connecting side 401, an opposite pressing side 402 and a pair of lateral sides 403 respectively and integrally connected to two ends of the connecting side 401 and the pressing side 402. The connecting side 401 forms a slightly upward bent positioning section 4011 and a pair of brace 4012 symmetrically disposed at two opposite ends thereof. The pressing side 402 forms a pressing section 4021 in the middle thereof to mate with a fastening section 504 of the load lever 50. The lateral sides 403 have a pair of clasping sections 4031 bent slightly downward in a middle section thereof, and form a pair of accessorial pressing members 4032 extending downward therefrom, adjacent the pressing side 402.

Referring to FIGS. 2 and 4, the accessorial pressing members 4032 are preferably stamped and formed integrally with the socket plate 40. Each accessorial pressing member 4032 has a sphere configuration. In another embodiment of the present invention, the accessorial pressing members 4032 are soldered to the socket plate 40. The accessorial pressing members 4032 are respectively positioned between the clasping section 4031 and the pressing side 402, and extend an identical distance away with respect to the lateral sides 403. The lower surfaces of the clasping sections 4031 and the accessorial pressing members 4032 jointly define an engaging force loading plane. The engaging force loading plane is parallel to a top surface of the LGA package 60. When the socket plate 40 is rotated to engage with the load lever 50, the clasping sections 4031 and the accessorial pressing members 4032 mate with the top surface of the LGA package 60 simultaneously.

The load lever 50 is an L-shape crank comprising a driving section 501 and a retaining section 502 substantially perpendicular to the driving section 501. A handle 503 is formed at a distal end of the driving section 501 for facilitating operation, and an offset fastening section 504 is formed at a center of the retaining section 502 for clipping the pressing section 4021.

Figure 3:
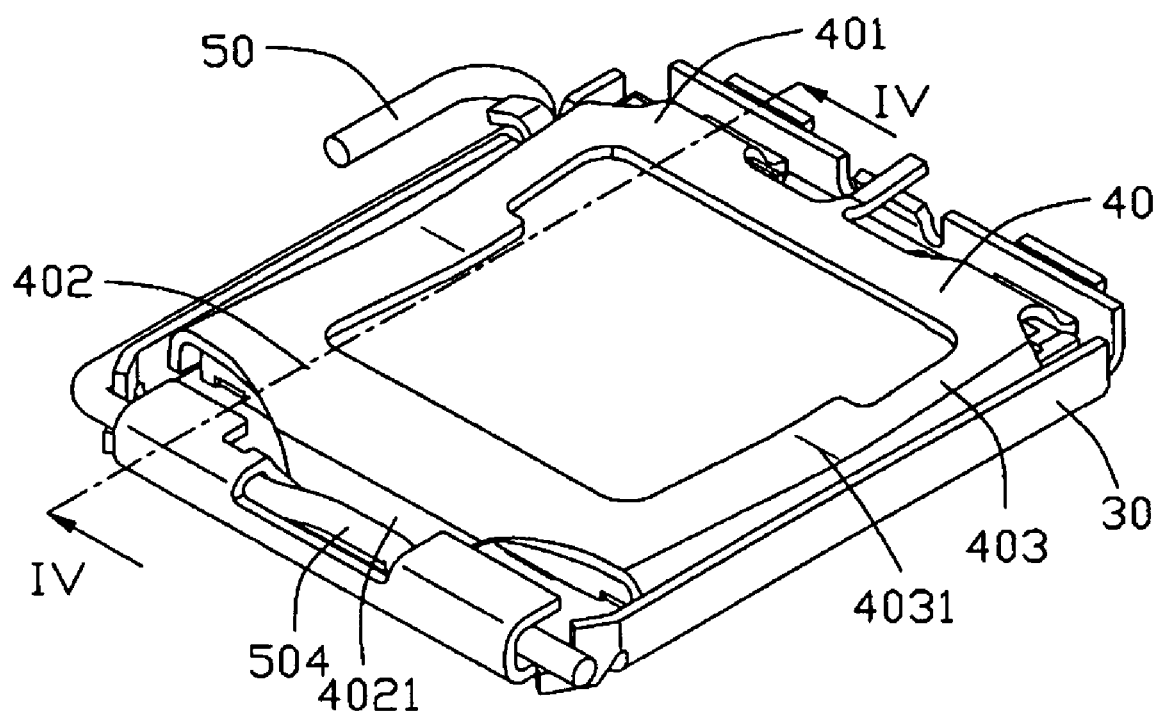
FIG. 3 is an assembled, isometric view of FIG. 1.

Referring to FIGS. 1 and 3, in assembly, the socket plate 40 is mounted to the rear sidewall 302, while the load lever 50 is assembled to the front sidewall 301. Prior to assembling the socket body 20 to the stiffener 30, the socket plate 40 and the load lever 50 are rotated afar with respect to the socket body 20. When the socket body 20 is assembled to the stiffener 30, the protrusions 201 of the socket body 20 substantially engage with corresponding recesses 3051 of the base 305. Therefore, the socket body 20 is firmly secured to the stiffener 30.

Referring to FIGS. 1 and 4, prior to setting the LGA package 60 on the socket body 20, the socket plate 40 and the load lever 50 are rotated far away from each other. After the LGA package 60 is properly positioned on the socket body 20, with the conductive pads resting on corresponding contacts 70 received in the socket body 20, the socket plate 40 is rotated toward the LGA package 60 till the clasping sections 4031 and the accessorial pressing members 4032 simultaneously meet the top surface of the LGA package 60. Thereafter, the load lever 50 is rotated to clip the socket plate 40, meanwhile the clasping sections 4031 and the accessorial pressing members 4032 are simultaneously urged to downwardly press the LGA package 60. In a closed position, the driving section 501 is held in the locking hook 3031 and the conductive pads on the LGA package 60 are substantially connected with corresponding contacts 70. Thus, reliable electrical connection between the LGA package 60 and the PCB is obtained.

When the socket plate 40 is rotated to engage with the load lever 50, the lower surfaces of the clasping sections 4031 and the accessorial pressing members 4032 simultaneously mate with the top surface of the LGA package 60, thereby ameliorating the engaging force distribution on the LGA package 60. The cooperation of the clasping sections 4031 and the accessorial pressing members 4032 effectively prevents the LGA package 60 from tilting relative to and sliding along the top surface of the socket body 20. Even the part of the LGA package 60 adjacent the load lever 50 is substantially pressed. Therefore, the contacts 70, including those adjacent the load lever 50 can firmly and steadily mate with corresponding conductive pads arranged on the LGA package 60. Thus, reliable electrical connection between the conductive pads of the LGA package 60 and the corresponding contacts 70 received in the socket body 20 is ensured.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A land grid array socket for electrically connecting a land grid array package with a circuit substrate, the socket comprising:
a socket body;
a plurality of contacts received in the socket body;
a stiffener attached to the socket body; and
a socket plate and a load lever respectively mounted to opposite ends of the stiffener, the socket plate comprising a connecting side to assemble to the stiffener, an opposite pressing side to engage with the load lever, and a pair of lateral sides respectively and integrally connected to the connecting side and the pressing side, wherein
the lateral sides of the socket plate form a pair of downwardly bent clasping sections around a middle section thereof and a pair of downwardly extending accessorial pressing members adjacent the pressing side, wherein each of the pair of clasping sections being substantially closer to a middle point of each lateral side than each of the pair of accessorial pressing members, the clasping sections and the accessorial pressing members cooperatively press a top surface of the land grid array package.

2. The land grid array socket as defined in claim 1, wherein the clasping sections and the accessorial pressing members have lower surfaces, and the lower surfaces jointly define an engaging force loading plane to engage the top surface of the land grid array package.

3. The land grid array socket as defined in claim 2, wherein the accessorial pressing members are integrally formed with the socket plate.

4. The land grid array socket as defined in claim 1, wherein the accessorial pressing members are mounted to the socket plate.

5. The land grid array socket as defined in claim 1, wherein said each accessorial pressing member has a sphere configuration.

6. The land grid array socket as defined in claim 5, wherein the stiffener is made of metal.

7. The land grid array socket as defined in claim 6, wherein the connecting side of the socket plate forms a pair of braces.

8. The land grid army socket as defined in claim 7, wherein the stiffener correspondingly defines a pair of slots to receive the braces formed on the socket plate.

9. The land grid array socket as defined in claim 8, wherein the pressing side of the socket plate forms a pressing section in the middle thereof.

10. The land grid array socket as defined in claim 9, wherein the load lever forms a fastening section to engage the pressing section.

11. The land grid array socket as defined in claim 10, wherein the stiffener forms a locking hook to clip the load lever.

12. The land grid array socket as defined in claim 11, wherein the socket body forms a plurality of protrusions extending outwardly therefrom.

13. The land grid array socket as defined in claim 12, wherein the stiffener correspondingly defines a plurality of recesses to receive the protrusions, thereby securely assembling the socket body to the stiffener.

14. An electrical connector for electrical connection between an electrical package and a circuit substrate, the electrical connector comprising:
a socket body;
a plurality of contacts received in the socket body;
a stiffener attached to the socket body; and
a socket plate and a load lever respectively mounted to opposite ends of the stiffener, the socket plate comprising a connecting side to assemble to the stiffener, an opposite pressing side to engage with the load lever, and a pair of lateral sides respectively and integrally connected to the connecting side and the pressing side, the lateral sides forming a pair of downwardly bent clasping sections around a middle section thereof and a pair of downwardly extending accessorial pressing members adjacent the pressing side, wherein each of the pair of clasping sections being substantially closer to a middle point of each lateral side than each of the pair of accessorial pressing members, the clasping sections and the accessorial pressing members cooperatively press a top surface of the electrical package.

15. The electrical connector as defined in claim 14, wherein the clasping sections and the accessorial pressing members have lower surfaces, and the lower surfaces jointly define an engaging force loading plane to engage the top surface of the electrical package.

16. The electrical connector as defined in claim 14, wherein the accessorial pressing members are integrally formed with the socket plate.

17. The electrical connector as defined in claim 14, wherein each accessorial pressing member has a sphere configuration.

18. The electrical connector as defined in claim 14, wherein the accessorial pressing members are assembled to the socket plate.

19. An electrical connector assembly comprising:
a socket body defining a front-to-back direction and an upward cavity;
a plurality of contacts received in the socket body with upper contacting tips extending into the cavity;
an electronic package received in the cavity;
a socket plate pivotally positioned upon the socket body and downwardly pressing the electronic package, the socket plate defining a pivotal end and a locking end around two opposite ends of said socket body in said front-to-back direction, and essentially defining a downward bowed configuration with a clasping section round a middle portion in said front-to-back direction to downwardly press against the electronic package; wherein
an auxiliary pressing section is downwardly formed on said socket plate between said clasping section and the locking end to assist engagement between the electronic package and the upper contacting tips of the contacts located close to said locking end the clasping section being substantially closer to a middle point of the socket plate than the auxiliary pressing section.

20. The assembly as claimed in claim 19, wherein said auxiliary pressing section completely circumferentially integrally connected to the socket plate in a rigid manner.

* * * * *